(12) United States Patent
Hirata et al.

(10) Patent No.: US 11,410,946 B2
(45) Date of Patent: Aug. 9, 2022

(54) SEMICONDUCTOR APPARATUS

(71) Applicant: Mitsubishi Electric Corporation, Tokyo (JP)

(72) Inventors: Daisuke Hirata, Tokyo (JP); Akihisa Yamamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/070,617

(22) Filed: Oct. 14, 2020

(65) Prior Publication Data

US 2021/0296462 A1 Sep. 23, 2021

(30) Foreign Application Priority Data

Mar. 23, 2020 (JP) .............................. JP2020-051131

(51) Int. Cl.
*H01L 23/52* (2006.01)
*H01L 23/00* (2006.01)
(Continued)

(52) U.S. Cl.
CPC .............. *H01L 24/04* (2013.01); *H01L 24/05* (2013.01); *H01L 24/45* (2013.01); *H01L 24/48* (2013.01); *H01L 29/452* (2013.01); *H01L 29/456* (2013.01); *H01L 29/4916* (2013.01); *H01L 2224/0215* (2013.01);
(Continued)

(58) Field of Classification Search
CPC ... H01L 2224/02145; H01L 2224/0215; H01L 2224/04042; H01L 2224/05008; H01L 2224/05011; H01L 2224/05017; H01L 2224/05093–05097; H01L 2224/051;
H01L 2224/05186–05188; H01L 2224/0519–05191; H01L 2224/05557; H01L 2224/05558; H01L 2224/0558–05584; H01L 2224/48453; H01L 2224/48463; H01L 2224/05666; H01L 29/66674–66734; H01L 29/7801–7826; H01L 2224/05078;
(Continued)

(56) References Cited

U.S. PATENT DOCUMENTS

| 5,962,919 A | 10/1999 | Liang et al. |
| 9,761,548 B1 * | 9/2017 | Irsigler .................. H01L 24/03 |

(Continued)

FOREIGN PATENT DOCUMENTS

| JP | H08-203952 A | 8/1996 |
| JP | 2012-109419 A | 6/2012 |

OTHER PUBLICATIONS

An Office Action issued by the German Patent and Trademark Office dated May 20, 2022, which corresponds to German Patent Application No. 102020133695.0 and is related to U.S. Appl. No. 17/070,617; with English language translation.

*Primary Examiner* — Yu Chen
(74) *Attorney, Agent, or Firm* — Studebaker & Brackett PC

(57) ABSTRACT

A semiconductor apparatus including a bonding region in which a wire is bonded, includes: a semiconductor substrate; an oxide film provided on a principal surface of the semiconductor substrate in the bonding region; a polysilicon layer provided on the oxide film; an interlayer film partially provided on the polysilicon layer; a barrier metal directly provided on the polysilicon layer and the interlayer film; and an electrode provided on the barrier metal.

4 Claims, 2 Drawing Sheets

(51) Int. Cl.
*H01L 29/45* (2006.01)
*H01L 29/49* (2006.01)

(52) U.S. Cl.
CPC ............... *H01L 2224/02125* (2013.01); *H01L 2224/02141* (2013.01); *H01L 2224/02145* (2013.01); *H01L 2224/04042* (2013.01); *H01L 2224/051* (2013.01); *H01L 2224/05008* (2013.01); *H01L 2224/05011* (2013.01); *H01L 2224/05012* (2013.01); *H01L 2224/05017* (2013.01); *H01L 2224/05083* (2013.01); *H01L 2224/05096* (2013.01); *H01L 2224/05188* (2013.01); *H01L 2224/05191* (2013.01); *H01L 2224/05557* (2013.01); *H01L 2224/05558* (2013.01); *H01L 2224/05582* (2013.01); *H01L 2224/05624* (2013.01); *H01L 2224/05666* (2013.01); *H01L 2224/45147* (2013.01); *H01L 2224/48453* (2013.01); *H01L 2224/48463* (2013.01)

(58) Field of Classification Search
CPC ... H01L 2224/48458; H01L 2224/4847; H01L 2224/05624
See application file for complete search history.

(56) References Cited

U.S. PATENT DOCUMENTS

2002/0121703 A1* 9/2002 Toyoda ............. H01L 21/76886
257/762
2003/0166334 A1* 9/2003 Lin ........................ H01L 24/05
438/627

* cited by examiner

SEMICONDUCTOR APPARATUS

BACKGROUND OF THE INVENTION

Field

The present disclosure relates to a semiconductor apparatus.

Background

When wire bonding is performed on an aluminum electrode, aluminum is excluded along an ultrasonic vibration direction. Thus, variation occurs in bonding strength between a wire and the aluminum electrode, which contributes to degradation of reliability of a semiconductor apparatus. In contrast, a semiconductor apparatus in which an interlayer film is partially provided under the aluminum electrode in a bonding region is disclosed (see, for example, JP 2012-109419 A). In this semiconductor apparatus, irregularities are generated on a surface of the aluminum electrode, so that exclusion of aluminum upon wire bonding can be suppressed.

SUMMARY

There is a case where a barrier metal layer is formed under an aluminum electrode. Adhesion between a barrier metal and an interlayer film is weak, thereby causing a problem of reduction in reliability of a semiconductor apparatus.

The present disclosure has been made to solve the problem as described above, and an object of the present disclosure is to obtain a semiconductor apparatus which is capable of reducing variation in bonding strength of wire bond and improving reliability.

A semiconductor apparatus to the present disclosure including a bonding region in which a wire is bonded, includes: a semiconductor substrate; an oxide film provided on a principal surface of the semiconductor substrate in the bonding region; a polysilicon layer provided on the oxide film; an interlayer film partially provided on the polysilicon layer; a barrier metal directly provided on the polysilicon layer and the interlayer film; and an electrode provided on the barrier metal.

In the present disclosure, the interlayer film is partially provided in the bonding region, and the barrier metal and the aluminum electrode are provided on the interlayer film. As such, the interlayer film becomes an anchor with respect to the barrier metal and the aluminum electrode upon bonding, so that exclusion of aluminum, which is a constituent metal of the aluminum electrode, can be suppressed. Thus, it is possible to reduce variation in bonding strength of wire bond. Further, the polysilicon layer is formed under the interlayer film. Adhesion between the barrier metal and the polysilicon layer is stronger than adhesion between the barrier metal and the interlayer film. Thus, adhesion of the barrier metal is improved by the polysilicon layer compensating for low adhesion between the barrier metal and the interlayer film, so that reliability of the semiconductor apparatus can be improved.

Other and further objects, features and advantages of the invention will appear more fully from the following description.

DESCRIPTION OF EMBODIMENTS

A semiconductor apparatus according to the embodiments of the present disclosure will be described with reference to the drawings. The same components will be denoted by the same symbols, and the repeated description thereof may be omitted.

First Embodiment

Figure 1:
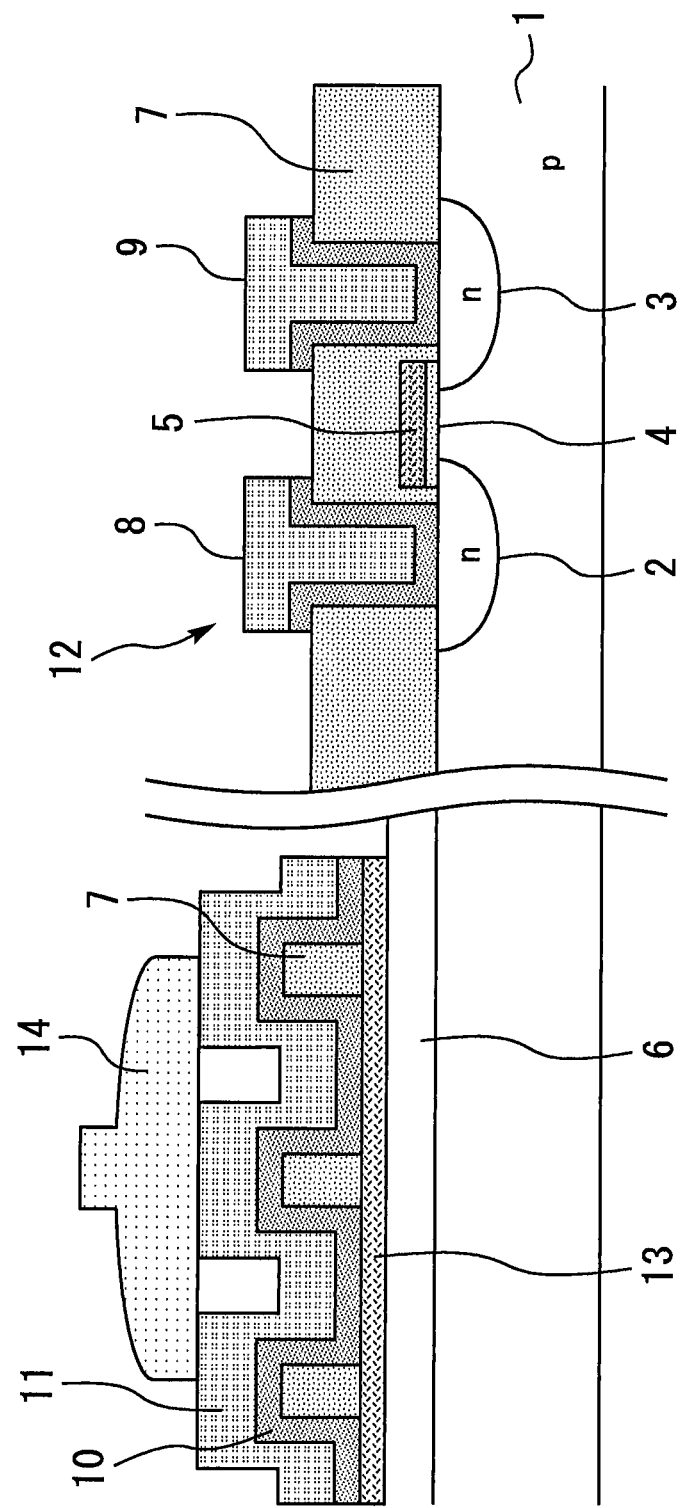
FIG. 1 is a cross-sectional view illustrating a semiconductor apparatus according to a first embodiment.

FIG. 1 is a cross-sectional view illustrating a semiconductor apparatus according to a first embodiment. A semiconductor substrate 1 is a p-type semiconductor substrate, and an n-type source region 2 and an n-type drain region 3 are provided apart from each other on a surface of the semiconductor substrate 1. A gate electrode 5 is formed in a portion between the source region 2 and the drain region 3 on the semiconductor substrate 1 via a gate insulating film 4. The gate electrode 5 is covered with an interlayer film 7. The interlayer film 7 is an oxide film, and has, for example, a laminate structure of TEOS/BPSG/TEOS.

A source electrode 8 is connected to the source region 2 via an opening of the interlayer film 7. A drain electrode 9 is connected to the drain region 3 via an opening of the interlayer film 7. The source electrode 8 and the drain electrode 9 are each made up of a barrier metal 10 and an aluminum electrode 11. The barrier metal 10 is provided to suppress increase of contact resistance of the aluminum electrode 11 and the semiconductor substrate 1, and has, for example, a laminate structure of Ti/TiN. In this manner, a transistor 12 such as MOSFET is formed on the semiconductor substrate 1.

The semiconductor apparatus includes a bonding region, in which a wire 14 is bonded, in an ineffective region which does not affect electrical characteristics of a semiconductor device such as the transistor 12 or a diode. In the bonding region, an oxide film 6 having a film thickness of 1,600 nm is provided on the semiconductor substrate 1. The oxide film 6 is a separating layer between semiconductor devices, and is, for example, $SiO_2$. A polysilicon layer 13 having a film thickness of 450 nm is provided on the oxide film 6. The interlayer film 7 having a film thickness of 1,500 nm is partially provided on the polysilicon layer 13. The barrier metal 10 having a film thickness of 100 nm is directly provided on the polysilicon layer 13 and the interlayer film 7 and is in contact with the polysilicon layer 13 and the interlayer film 7. The aluminum electrode 11 having a film thickness of 13,000 nm is provided on the barrier metal 10.

Here, portions above the interlayer films 7 are convex, and portions above regions between the interlayer films 7 are concave. That is, a surface of the aluminum electrode 11 has a shape having recesses and protrusions to conform to a pattern of the interlayer film 7. In the bonding region, the wire 14 is bonded to the aluminum electrode 11 whose surface has a shape having recesses and protrusions. The wire 14 is, for example, a copper wire. Note that since a copper wire has high hardness and low bondability, a constituent metal of the aluminum electrode 11 is likely to be excluded upon bonding.

The aluminum electrode 11 in the bonding region is electrically connected to the source electrode 8 or the drain electrode 9 of the transistor 12. Thus, the transistor 12 is connected to an external circuit via the wire 14.

In the present embodiment, the interlayer film 7 is partially provided in the bonding region, and the barrier metal 10 and the aluminum electrode 11 are provided on the interlayer film 7. As such, the interlayer film 7 becomes an anchor with respect to the barrier metal 10 and the aluminum electrode 11 upon bonding, so that exclusion of aluminum, which is a constituent metal of the aluminum electrode 11, can be suppressed. Thus, it is possible to reduce variation in bonding strength of wire bond. Further, the polysilicon layer 13 is formed under the interlayer film 7. Adhesion between the barrier metal 10 and the polysilicon layer 13 is stronger than adhesion between the barrier metal 10 and the interlayer film 7. Thus, adhesion of the barrier metal 10 is improved by the polysilicon layer 13 compensating for low adhesion between the barrier metal 10 and the interlayer film 7, so that reliability of the semiconductor apparatus can be improved.

The polysilicon layer 13 and the gate electrode 5 are made of the same material. Thus, it is possible to form the polysilicon layer 13 and the gate electrode 5 at the same time in manufacturing process. However, the polysilicon layer 13 and the gate electrode 5 are not connected to each other.

Figure 2:
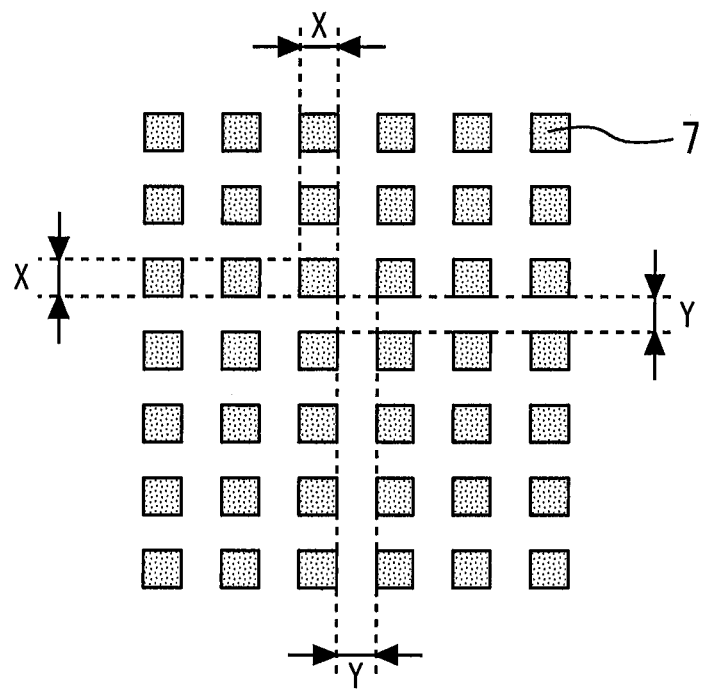
FIG. 2 is a plan view illustrating a pattern of the interlayer film in the bonding region of the semiconductor apparatus according to the first embodiment.

To bring the source electrode 8 and the drain electrode 9 into contact with the semiconductor substrate 1, the interlayer film 7 is etched to form openings. At this time, the interlayer film 7 in the bonding region is also patterned. FIG. 2 is a plan view illustrating a pattern of the interlayer film in the bonding region of the semiconductor apparatus according to the first embodiment. The interlayer film 7 has a dot pattern in planar view perpendicular to a principal surface of the semiconductor substrate 1. If the horizontal and vertical sizes of a dot are denoted by X, and the interval between dots is denoted by Y, X and Y are both from 2 um to 5 um. The aluminum electrode 11 provided on the interlayer film 7 having a dot pattern also bulges in a dot shape in a similar manner. Thus, an area where the wire 14 is in contact with the aluminum electrode 11 becomes small, so that variation in exclusion of aluminum of the aluminum electrode 11 can be suppressed.

Second Embodiment

Figure 3:
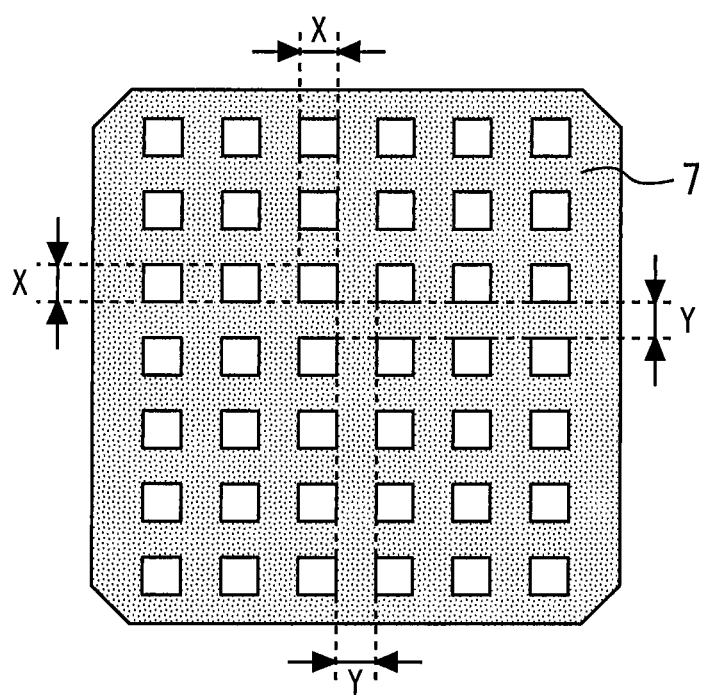
FIG. 3 is a plan view illustrating a pattern of the interlayer film in the bonding region of the semiconductor apparatus according to a second embodiment.

FIG. 3 is a plan view illustrating a pattern of the interlayer film in the bonding region of the semiconductor apparatus according to a second embodiment. The interlayer film 7 has a mesh pattern in planar view perpendicular to the principal surface of the semiconductor substrate 1. If the horizontal and vertical sizes of an opening of the mesh is denoted by X, and an interval between openings of the mesh is denoted by Y, X and Y are both from 2 um to 5 um. Other configurations are similar to those in the first embodiment.

Since the interlayer film 7 has a mesh pattern, compared to a case where the interlayer film 7 has a dot pattern, an area where the wire 14 is in contact with the aluminum electrode 11 becomes larger. As such, it is possible to perform bonding with less force than that in a case of a dot pattern, so that damage to the semiconductor device is reduced. However, exclusion of aluminum of the aluminum electrode 11 slightly varies.

The semiconductor substrate 1 is not limited to a substrate formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor apparatus formed of such a wide-bandgap semiconductor has a high voltage resistance and a high allowable current density, and thus can be miniaturized. The use of such a miniaturized semiconductor apparatus enables the miniaturization and high integration of the semiconductor module in which the semiconductor apparatus is incorporated. Further, since the semiconductor apparatus has a high heat resistance, a radiation fin of a heatsink can be miniaturized and a water-cooled part can be air-cooled, which leads to further miniaturization of the semiconductor module. Further, since the semiconductor apparatus has a low power loss and a high efficiency, a highly efficient semiconductor module can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-051131, filed on Mar. 23, 2020 including specification, claims, drawings and summary, on which the convention priority of the present application is based, is incorporated herein by reference in its entirety.

The invention claimed is:

1. A semiconductor apparatus including a bonding region in which a wire is bonded, comprising:
   a semiconductor substrate;
   an oxide film provided on a principal surface of the semiconductor substrate in the bonding region;
   a polysilicon layer provided on the oxide film;
   an interlayer film partially provided on the polysilicon layer;
   a barrier metal directly provided on the polysilicon layer and the interlayer film; and
   an electrode provided on the barrier metal, wherein
   a surface of the electrode has a shape having recesses and protrusions to conform to a pattern of the interlayer film,
   upon bonding of a wire to the protrusions of the electrode in a bonding area on a surface of the electrode, an outermost boundary of the bonding area being an outline of the outermost portion of the bond between the wire and the surface of the electrode, a total area of the electrode surface bounded by the outermost boundary is greater than a total area of the wire directly contacting the electrode within the area of the electrode surface bounded by the outermost boundary,
   the interlayer film is a dot pattern or a mesh pattern in planar view perpendicular to the principal surface,
   horizontal and vertical sizes of a dot of the dot pattern or an opening of the mesh pattern are denoted by X,
   an interval size between dots of the dot pattern or openings of the mesh pattern are denoted by Y, and
   X and Y are both from 2 µm to 5 µm.

2. The semiconductor apparatus according to claim 1, further comprising a transistor formed on the semiconductor substrate and including a gate electrode,
   wherein the polysilicon layer and the gate electrode are made of same material.

3. The semiconductor apparatus according to claim 2, wherein the semiconductor substrate is formed of a wide-bandgap semiconductor.

4. The semiconductor apparatus according to claim 1, wherein the semiconductor substrate is formed of a wide-bandgap semiconductor.

* * * * *